(12) United States Patent
Nolet et al.

(10) Patent No.: US 11,782,393 B2
(45) Date of Patent: Oct. 10, 2023

(54) TIME TO DIGITAL CONVERSION

(71) Applicant: SOCPRA SCIENCES ET GENIE S.E.C., Sherbrooke (CA)

(72) Inventors: Frédéric Nolet, Sherbrooke (CA); Nicolas Roy, Sherbrooke (CA); Jean-François Pratte, St-Catherine de Hatley (CA); Frederik Dubois, Roberval (CA)

(*) Notice: Subject to any disclaimer, the term of this patent is extended or adjusted under 35 U.S.C. 154(b) by 0 days.

(21) Appl. No.: 17/998,519

(22) PCT Filed: Jun. 2, 2021

(86) PCT No.: PCT/CA2021/050746
§ 371 (c)(1),
(2) Date: Nov. 11, 2022

(87) PCT Pub. No.: WO2021/243451
PCT Pub. Date: Dec. 9, 2021

(65) Prior Publication Data
US 2023/0185250 A1    Jun. 15, 2023

Related U.S. Application Data

(60) Provisional application No. 63/035,473, filed on Jun. 5, 2020.

(51) Int. Cl.
*G04F 10/00* (2006.01)
*H03K 5/01* (2006.01)
(Continued)

(52) U.S. Cl.
CPC ........ *G04F 10/005* (2013.01); *H03K 3/0315* (2013.01); *H03K 5/01* (2013.01); *H03K 2005/00078* (2013.01)

(58) Field of Classification Search
CPC ...... G04F 10/005; H03K 3/0315; H03K 5/01; H03K 2005/00078
(Continued)

(56) References Cited

U.S. PATENT DOCUMENTS 3,218,553 A    11/1965  Peterson et al.
3,505,594 A     4/1970  Tarczy-Homoch et al.
(Continued)

OTHER PUBLICATIONS

International application No. PCT/CA2021/050746 International Search Report dated Sep. 9, 2021.
(Continued)

*Primary Examiner* — Ryan Jager

(57) ABSTRACT

Time-to-digital converter (TDC) using multiple Vernier in a cascaded architecture reduces the timing jitter by decreasing the number of the ring oscillator cycles during the measurement processes. Time-to-digital converter (TDC) measurements using a third oscillator for the second Vernier process has significant advantages compared to changing the period of the second oscillator during the measurement cycle. The Vernier architecture described herein may operate with faster oscillators, reducing the number of intervals before converging and leading to a lower time conversion and a better timing jitter Adding multiple cascaded Vernier interpolation may further improve the TDC measurement resolution while having only a small increment of time required to resolve the time interval calculations.

12 Claims, 13 Drawing Sheets

(51) Int. Cl.
*H03K 3/03* (2006.01)
*H03K 5/00* (2006.01)

(58) Field of Classification Search
USPC .......................................................... 327/596
See application file for complete search history.

(56) References Cited

U.S. PATENT DOCUMENTS

| | | | |
|---|---|---|---|
| 4,164,648 A | 8/1979 | Chu | |
| 8,519,880 B2* | 8/2013 | Kawaguchi | H03M 1/50 341/111 |
| 10,007,235 B2 | 6/2018 | Wang et al. | |
| 11,533,058 B2* | 12/2022 | Wu | H03L 7/1974 |
| 2011/0084863 A1 | 4/2011 | Chiu et al. | |
| 2012/0286987 A1* | 11/2012 | Kawaguchi | H03M 3/416 341/166 |

OTHER PUBLICATIONS

International application No. PCT/CA2021/050746 Search Strategy dated Sep. 9, 2021.

International application No. PCT/CA2021/050746 Written Opinion of the International Searching Authority dated Sep. 9, 2021.

Roy et al., Low Power and Small Area, 6.9 ps RMS Time-to-Digital Converter for 3-D Digital SiPM. IEEE Transactions on Radiation and Plasma Medical Sciences, Sep. 27, 2017, vol. 1, pp. 486-494.

Sesta et al., A novel sub-10 ps resolution TDC for CMOS SPAD array. 2018 25th IEEE International Conference on Electronics, Circuits and Systems (ICECS), Dec. 12, 2018, pp. 5-8.

B. Markovic, et al., A High-Linearity, 17 ps Precision Time-to-Digital Converter Based on a Single-Stage Vernier Delay Loop Fine Interpolation, in IEEE Transactions on Circuits and Systems I: Regular Papers, vol. 60, No. 3, pp. 557-569, Mar. 2013.

* cited by examiner

TIME TO DIGITAL CONVERSION

CROSS-REFERENCE TO RELATED APPLICATIONS

This application claims priority from U.S. provisional patent application 63/035,473 filed Jun. 5, 2020, the contents of which are hereby incorporated by reference.

TECHNICAL FIELD

The present patent application relates to the field of time-to-digital conversion methods and circuits in which time resolution less than the nearest clock pulse is obtained.

BACKGROUND

A time-to-digital converter or TDC is a circuit that measures the difference between a start and stop signal to obtain the duration of an event and/or the time of occurrence of an event and outputs a digital value corresponding to the time of the event. For example, the number of clock cycles between a start signal input and a stop signal input can be digitally counted. When the time resolution sought is equivalent to the period of the clock circuit, this approach works well. For example, an oscillator running at 500 MHz will resolve a time measurement to the nearest 2 ns, and 1 GHz to the nearest 1 ns.

In some applications, there is a need for time resolution less than 10 ps. Operating an oscillator and counting integral clock cycles at this speed is not feasible or practical with current electronic circuitry.

An approach known in the art is to use a Vernier circuit that will resolve the time difference. In the Vernier approach, the start signal triggers a first oscillator and the stop signal triggers a second oscillator that has a different period from the first oscillator. A coincidence circuit detects when the fast oscillator overtakes the slow oscillator, and this measurement allows to resolve a time interval smaller than the oscillator period.

The resolution in a Vernier circuit depends on the difference between the first and second oscillators' period, with an increasingly smaller difference leading to increasingly better resolution, while also requiring increasingly more time on average to reach the state when one of the two oscillators overtakes the other.

With a view to reduce the measurement time while achieving good resolution, it has been proposed to change the period of the second oscillator that was originally faster than the first to become slower after the detection of one of the two oscillators overtaking the other. This approach is disclosed in the paper titled "A novel sub-10 ps resolution TDC for CMOS SPAD array" by V. Sesta et al. and published in the conference proceedings of 2018 *25th IEEE International Conference on Electronics, Circuits and Systems (ICECS), Bordeaux*. Once the oscillator's period is changed, the number of oscillator cycles is counted until one of the two oscillators overtakes the other a second time.

The time measured by the second Vernier process is then subtracted from the time measured by the first Vernier process, thereafter providing the final time measurement. This provides a double Vernier process. The overall Vernier detection can be made faster on average because each Vernier resolves the time with less interpolation steps: the first Vernier uses a greater period difference (coarse timing resolution) while the second Vernier uses a smaller period difference (finer timing resolution), but with a smaller range (residue of the first Vernier) instead of the whole TDC range. In addition to a lower overall conversion time than a single Vernier process offering a similar timing resolution, a double Vernier process provides a better timing jitter since less timing uncertainty is accumulated during each Vernier process.

For the TDC circuitry proposed in the Sesta et al. paper to operate properly, the detection of one of the two ring oscillators overtakes the other and the change in the second oscillator period must be accomplished within half of one oscillator period. The proposed circuitry uses a reference oscillator having a period of 5 ns. This choice of a long period (relative to the ultimate desired precision of less than 10 ps) indeed allows for the detection and the change in the oscillator period to be achieved in time. However, it also means that the Vernier processes are used to resolve a value within over 500 intervals (5 ns=5000 ps, and 5000 ps/10 ps=500 intervals). This makes the time measurement more time consuming and less precise (more accumulated jitter).

SUMMARY

Applicant has found that using multiple Vernier in a cascaded architecture reduced the timing jitter as it decreases the number of the ring oscillator cycles during the measurement processes (as a first interpolation is made with a large LSB (Least Significant Bit), followed by a second interpolation with a finer LSB; each interpolation only requiring a low number of cycles to converge compared to a single Vernier process that would have the same resolution).

Applicant has discovered that TDC measurements using a third oscillator for the second Vernier process had significant advantages compared to the prior art in which the second Vernier process is completed after modifying the period at which one of the oscillator functions.

Applicant found that using a separate oscillator in the second Vernier process increased control over the resolution in terms of the LSB range at which the second interpolation is made. The prior art teaches using the coincidence circuitry to modify the propagation delay of one of the oscillator cells, which limits the range of period at which the oscillator may run its second interpolation due to the limited tuning range of a single delay element, whereas a separate oscillator may function at any desired period.

Applicant has further found that using a third separate oscillator released the timing constraints in which the second oscillator period must change within half of its cycle. The Vernier processes can therefore operate with faster oscillators, reducing the number of intervals and leading to a lower time conversion and a better timing jitter.

Applicant has also found that TDC measurement using cascaded Vernier may have further improvement to its resolution, for a small increment of time required to resolve the time interval calculations, by adding multiple cascaded Vernier interpolation.

Applicant has further discovered that using timing delays in the Vernier circuitry detecting the coincidence, passing-through the signal from one of the oscillators and triggering the start of a third oscillator for the second Vernier process, allows the choice of the edge of timing information that is sent to the next Vernier. The use of delays that may be smaller or greater than the period of the slow oscillator, therefore, allows for choosing between a forward/backward or a forward/forward approach for the convergence. This level of freedom cannot be achieved with the Sesta et al approach where a forward/backward scheme is the only possible mode of convergence with two oscillators.

A broad aspect is a time-to-digital converter including: a start/stop prelogic circuit receiving external input and providing a first gate signal and a second gate signal; a first oscillator having a first period and initiated by one of the first and second gate signals; a second oscillator having a second period and initiated by another of the first and second gate signals; a third oscillator having a third period, and initiated by a third gate signal; a first counter connected to one of the first oscillator and the second oscillator; a third counter connected to the third oscillator; a first coincidence circuit connected to the first oscillator and to the second oscillator and having a first coincidence output signal indicating when one of the first oscillator and the second oscillator overtakes the other; a first delay $\tau_1$ connected to the first oscillator and having a passthrough circuit, connected to said first coincidence output signal, gating the said first oscillator output delayed by $\tau_1$; a second delay $\tau_2$ connected to the second oscillator and having a prelogic circuit to provide a start signal, synced with the second oscillator but delayed by $\tau_2$ to the third oscillator; a second coincidence circuit connected to the output of the first delay and to the third oscillator and having a second coincidence output signal indicating when one of the first oscillator delayed by the first delay and the third oscillator overtakes the other; and a digital time readout connected to the first counter and the third counter and outputting a digital value for a time between the first gate signal and the second gate signal; where at least one of the first delay and the second delay is longer than a time for the first coincidence circuit to produce the first output signal following a time when the one of the first oscillator and the second oscillator overtakes the other; to read the first counter when the first coincidence is reached, one of: the first counter is connected to the second oscillator, the first coincidence output signal is connected to the second oscillator to stop the second oscillator such that the first counter is halted; the first coincidence output signal is connected to stop the first counter; and the first coincidence output signal is connected to the digital time readout; to read the third counter when the second coincidence is reached, one of: the second coincidence output signal is connected to the first and third oscillator to stop the first and third oscillator such that the third counter is halted; the second coincidence output signal is connected to stop the third counter; and the second coincidence output signal is connected to the digital time readout.

In some embodiments, the first counter is connected to the first oscillator, further including a second counter connected to the second oscillator and the digital time readout is further connected to the second counter.

In some embodiments, the first coincidence circuit is connected to the start/stop prelogic circuit to stop the second oscillator when the first coincidence is reached.

In some embodiments, the second coincidence circuit is connected to the start/stop prelogic circuit and to the second delay's prelogic circuit to stop the first and third oscillators when the second coincidence is reached.

In some embodiments, the first coincidence circuit is connected to the second counter to stop the second counter when the first coincidence is reached.

In some embodiments, the second coincidence circuit is connected to the first counter and the third counter to stop the first and third counters when the second coincidence is reached.

In some embodiments, the second coincidence circuit is connected to any one of the counters, the oscillators, and the prelogic circuits to stop the counters when the second coincidence is reached.

In some embodiments, the digital time readout transforms the counters values to a time value when the second coincidence is reached.

In some embodiments, the time-to-digital converter further includes one or more additional oscillators and a same number of additional counters, delays and coincidence circuits, where the additional coincidence circuits indicates when one of the first oscillator delayed by the first delay and additional delays and the additional oscillator overtakes the other.

In some embodiments, the first oscillator, the second oscillator and the third oscillator have a period of approximately 0.5 nanoseconds and a time resolution of the digital value for a time between the first gate signal and the second gate signal is less than 20 picoseconds.

In some embodiments, the time resolution is less than 10 picoseconds.

In some embodiments, any one of the first and second delay is shorter than the time for the first coincidence to produce the first output signal.

In some embodiments, the first delay is different than the second delay.

Another broad aspect is an imaging device including: an array of photon detectors, where each photon detector or a group of photon detectors of the array of photon detectors is connected to a time-to-digital converter.

BRIEF DESCRIPTION OF THE DRAWINGS

The invention will be better understood by way of the following detailed description of embodiments of the invention with reference to the appended drawings, in which.

DETAILED DESCRIPTION

The present disclosure relates to a time-to-digital converter (TDC) using ring oscillators-based cascaded Vernier. Although this description emphasizes on providing better timing jitter, the reader must understand that this disclosure can also be used for applications requiring low dead time, low power consumption, low area and low cost as well. For example, it is well suited for medical imaging, range finding, 3D biometric recognition, quantum key distribution, quantum sensing and other circuits such as phase-locked loops.

Ring oscillator-based Vernier TDC architecture is well known in the art and is widely used to increase the timing resolution up to virtually unlimited values. In contrary to other architectures, where the timing resolution depends on the absolute ring oscillator period, a Vernier TDC timing resolution relies on the period difference between two ring oscillators.

Reducing the time required to perform the measurement and reducing the timing jitter of the known ring oscillator-based Vernier TDC architecture is required to improve technologies using picoseconds time intervals measurements.

PRIOR ART

Figure 1A:
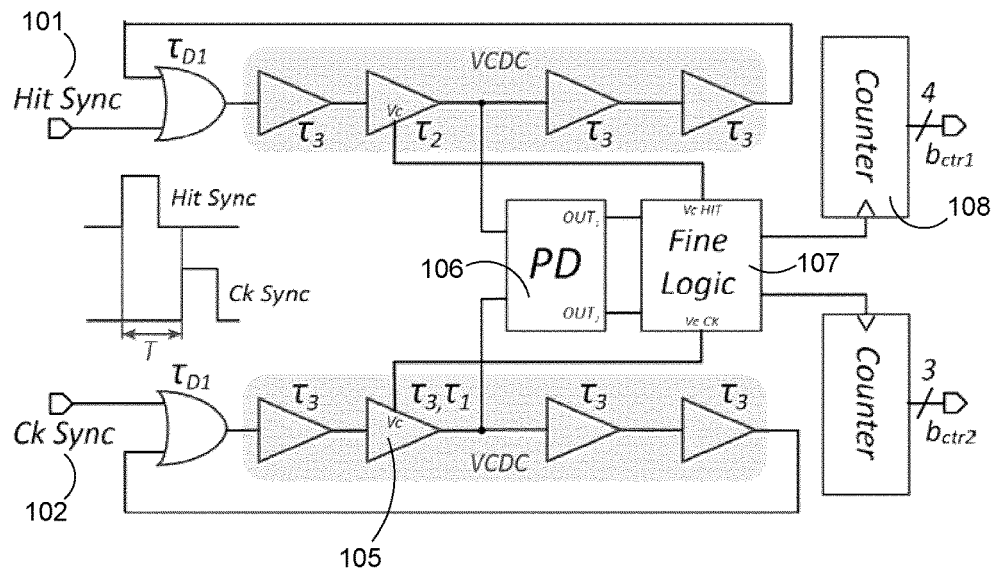
FIG. 1A is a block schematic of a prior art Vernier dual fine interpolator TDC with logic to modify the propagation delay of a single cell to change the resolution between the two interpolations.

FIG. 1A is a block schematic of the previously mentioned Sesta prior art. In this reference, the time interval between the Hit Sync 101 and the Ck Sync 102 is measured by two subsequent interpolations. This architecture comprises two oscillators which are used in both interpolations. Following the coincidence detection 106 during the first interpolation, the fine logic circuit 107 modifies the propagation delay of a single cell 105 from one of the oscillators.

The second interpolation is subsequently done between the first oscillator and the second oscillator at its new period. This effectively provides a double Vernier process, but with a limited LSB range between the first and second interpolation and allowing only a forward/backward convergence scheme as described herein. It also increases timing constraints in which the second oscillator period must change within half of its cycle. A longer period is hence required, at the cost of a higher number of cycles, degrading timing jitter and dead time.

Figure 1B:
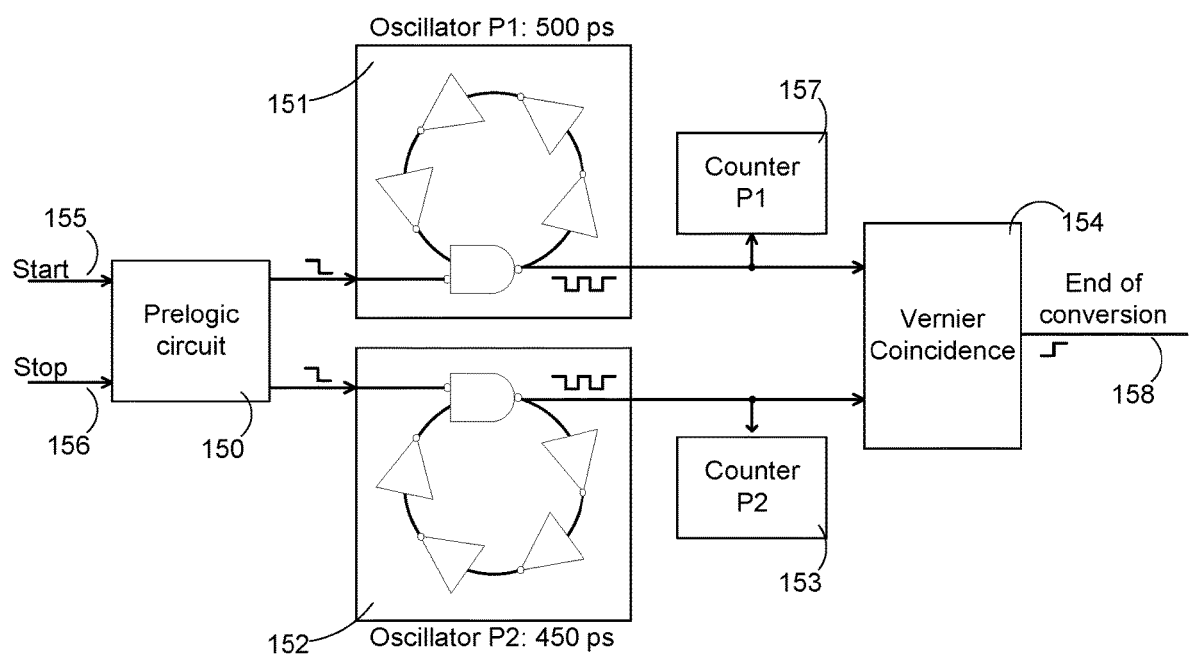
FIG. 1B is a block schematic of a prior art ring oscillator-based Vernier TDC.

Now referring to FIG. 1B illustrates a prior art architecture of a ring oscillator-based single Vernier TDC. A prelogic circuit 150 controls the ring oscillators with conditioned start 155 and stop 156 trigger signals. A single Vernier TDC only requires two oscillators 151, 152 functioning at different period in order to measure the interval between the start 155 and stop 156 signals. The single Vernier TDC comprises a counter 153 to store the number of cycles the fast ring oscillator 152, triggered by the stop signal 156, while another counter 157 tracks the slow oscillator 151, triggered by the start signal 155.

The architecture presented in FIG. 1B further comprises a coincidence circuit 154 which determines the coincidence occurrence, consisting of the fast oscillator catching up the slow oscillator, and ends up the TDC conversion 158.

Double Vernier Triple Oscillators

FIGS. 2A, 2B, 2C and 2D illustrate exemplary embodiments of the present cascaded Vernier TDC disclosure with differences in the way the TDC stops counting. These block schematics represent a double Vernier triple oscillator (DVTO) architecture. Similar to the prior art of FIG. 1B, the DVTO architecture comprises a prelogic circuit 150 which receives a start 155 and a stop 156 trigger signal. The start 155 and stop 156 signals may be any signals such as an event triggering the start 155 signal and a clock signal producing constant intervals at a given period that is known at the stop signal 156.

The start 155 signal is the trigger starting the slow oscillator 151 whereas the stop 156 signal is the trigger starting the fast oscillator 152. The circuitry of the prelogic circuit 150 controls the state of the oscillators 151 and 152 by providing enable signals. The enable signals can be either LO state or HI state depending on the oscillator control (in FIG. 1A, the oscillator is started when the input goes HI, while in FIGS. 1B and 2A, the trigger for the oscillator is for the prelogic circuit output to go LO) and may remain in their state until a reset input signal is received. The reset signal may cause the enable signals to be reset to their original state, prior the TDC conversion, when all oscillators are not running. For example, the prelogic circuit may provide an enable signal to oscillator 151 when start signal 155 arrives and may provide an enable signal to oscillator 152 when stop signal 156 arrives. The circuitry of the prelogic circuit 150 can be, for example, the one presented in FIG. 10, including circuitry to avoid the stop signal 156 triggering the fast oscillator 152 prior the slow oscillator 151, which would cause an inverted Vernier scheme and would need to be managed by the first coincidence circuit 201.

This architecture comprises a first counter 157 that records the number of cycles the slow oscillator 151 has done prior to the stop 156 trigger signal to extend the TDC dynamic range beyond the slow oscillator 151 period and a second counter 153 that records the number of cycles the fast oscillator 152 is lead by the slow oscillator 151. If the TDC dynamic range is limited to the slow oscillator 151 period, there is no need to use a counter 157 at the output of the slow oscillator 151, hence only two counters, 153 and 203, are needed. The first Vernier coincidence 201 circuit assesses the occurrence of the coincidence between the slow and the fast oscillators 151, 152 in order to stop the second counter 153 and to further start the third oscillator 202. The Vernier coincidence 201 circuit may activate the delay and gated passthrough circuit 210 to allow the slow oscillator's 151 signal to pass-through to the second Vernier Coincidence 154 circuit (the second Vernier).

The function of this second Vernier process is similar to the first Vernier process, but instead of measuring the interval between the start 155 and the stop 156 signals, it is used to measure the residual time of the first Vernier process. As will be further demonstrated in the description of FIG. 6, the interval measured by this second Vernier process is the time residue introduced by the cycle length difference between the first and second oscillators, namely the residue, due to the fact that there is not a perfect coincidence between the signals, but rather an overtaking of one compared to the other.

Similar to the first Vernier process, the second Vernier comprises a second Vernier coincidence 154 circuit and a third counter 203 in order to record the number of cycles it takes for the first and third oscillators to converge. Once the coincidence has been reached, the second Vernier coincidence 154 circuit outputs an end of conversion 158 signal.

The output of the first coincidence circuit 201 causes the counter 153 to stop and a delay and prelogic circuit 212 to start the third oscillator 202 with period P3, using the timing based on the second oscillator 152. Thus, the second coincidence circuit 154 can then resolve the time residue introduced by oscillators P1 and P2.

In the example of FIGS. 2A, 2B, 2C, and 2D, P1 is 500 ps, and the time for circuit 201 to conclude that one of its input oscillator signals has overtaken the other can be too long for oscillator 202 to be started directly from the output of circuit 201 and would cause significant timing error. The delays provided by circuits 210 and 212 allow for the coincidence of P1 and P3 to be resolved with less variability or error in circuit 154.

In the exemplary embodiment of FIGS. 2A, 2B, 2C, and 2D, the third oscillator 202 has a period that is slower than the slow (first) oscillator 151. This is such that the convergence interpolations are made in the forward and then backward scheme.

Other embodiments may converge using different methods of the Vernier process, such as always forward or always backward convergence.

Figure 5A:
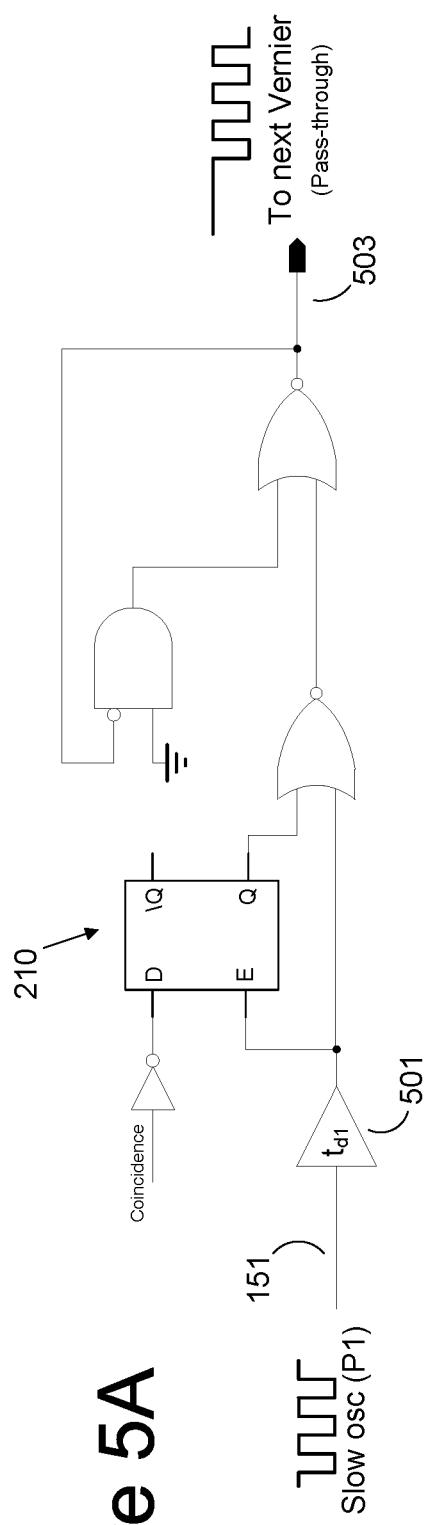
FIG. 5A is a block schematic illustrating an exemplary gated pass-through circuit for the slow oscillator.
Figure 5B:
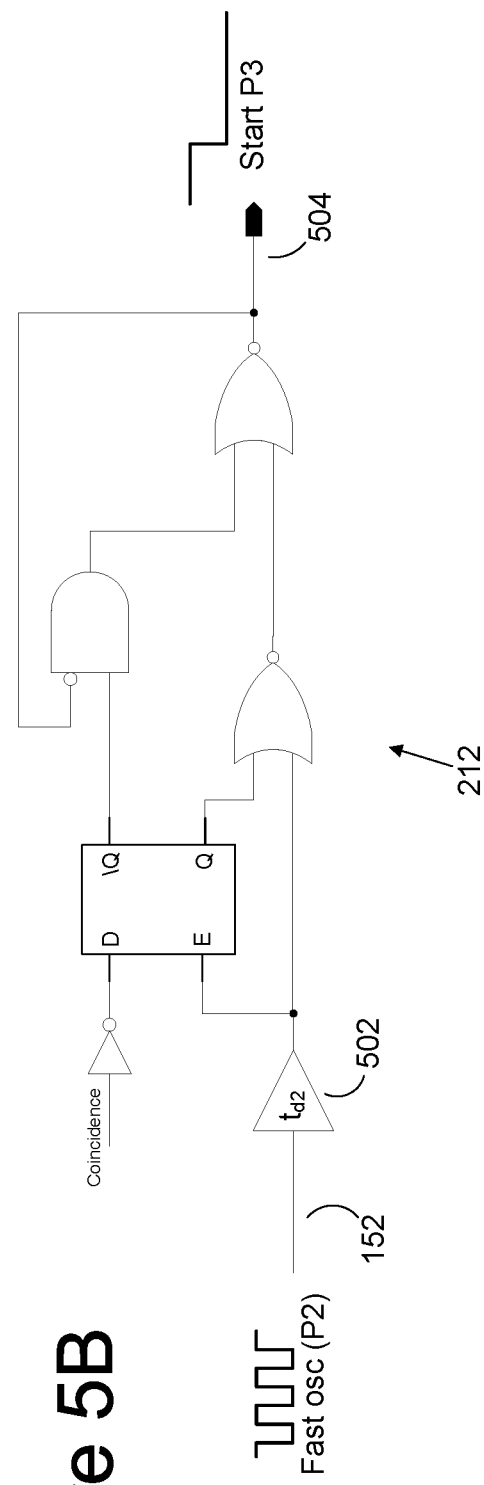
FIG. 5B is a block schematic illustrating a start command for the third oscillator passing through a timing delay.

An always forward scheme is achieved by adjusting time delays 501 and 502 of FIGS. 5A and 5B to have a resulting delay greater than the slow oscillator's period in such manner that the residue passed to the next Vernier process is referenced to the $n^{th}$ cycle prior the coincidence assessment. This effectively provides a positive residue, allowing for an always forward approach.

A person skilled in the art will appreciate that other methods of convergence (e.g. backward/forward, backward/backward) may be done with small changes (e.g. oscillator's period, time delays) without departing from the teachings of this disclosure. Additionally, the oscillators periods described herein are given for exemplary purposes only and should not be considered as limiting the scope of the disclosure. Someone skilled in the art will appreciate that using different periods for one or more of the oscillators may be done without departing from the teachings of this disclosure.

Figure 2A:
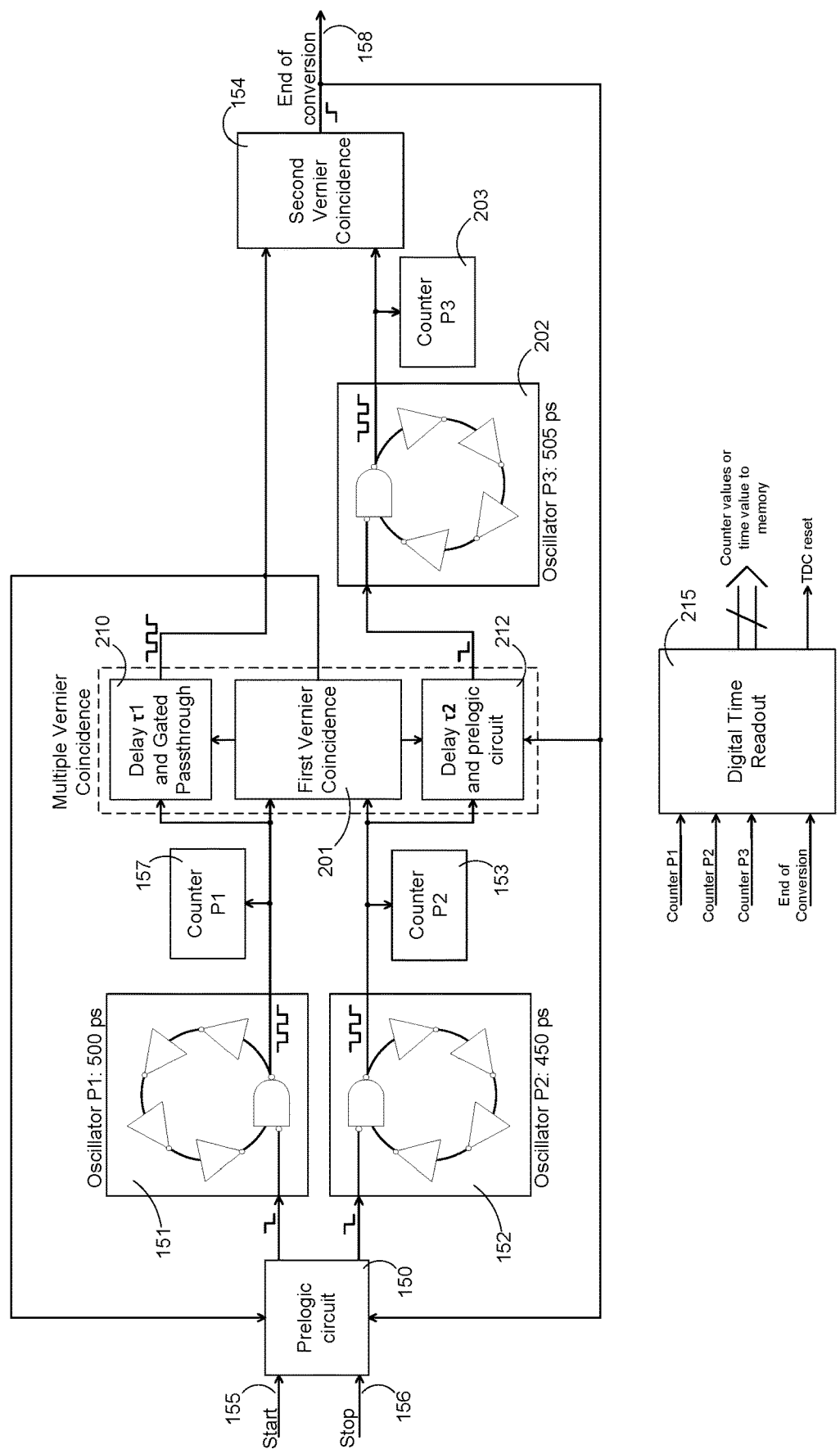
FIG. 2A is a block schematic illustrating an exemplary ring oscillator-based double Vernier TDC comprising three separate oscillators functioning at different periods with coincidence output signals connected to prelogic circuits to end conversion.
Figure 2B:
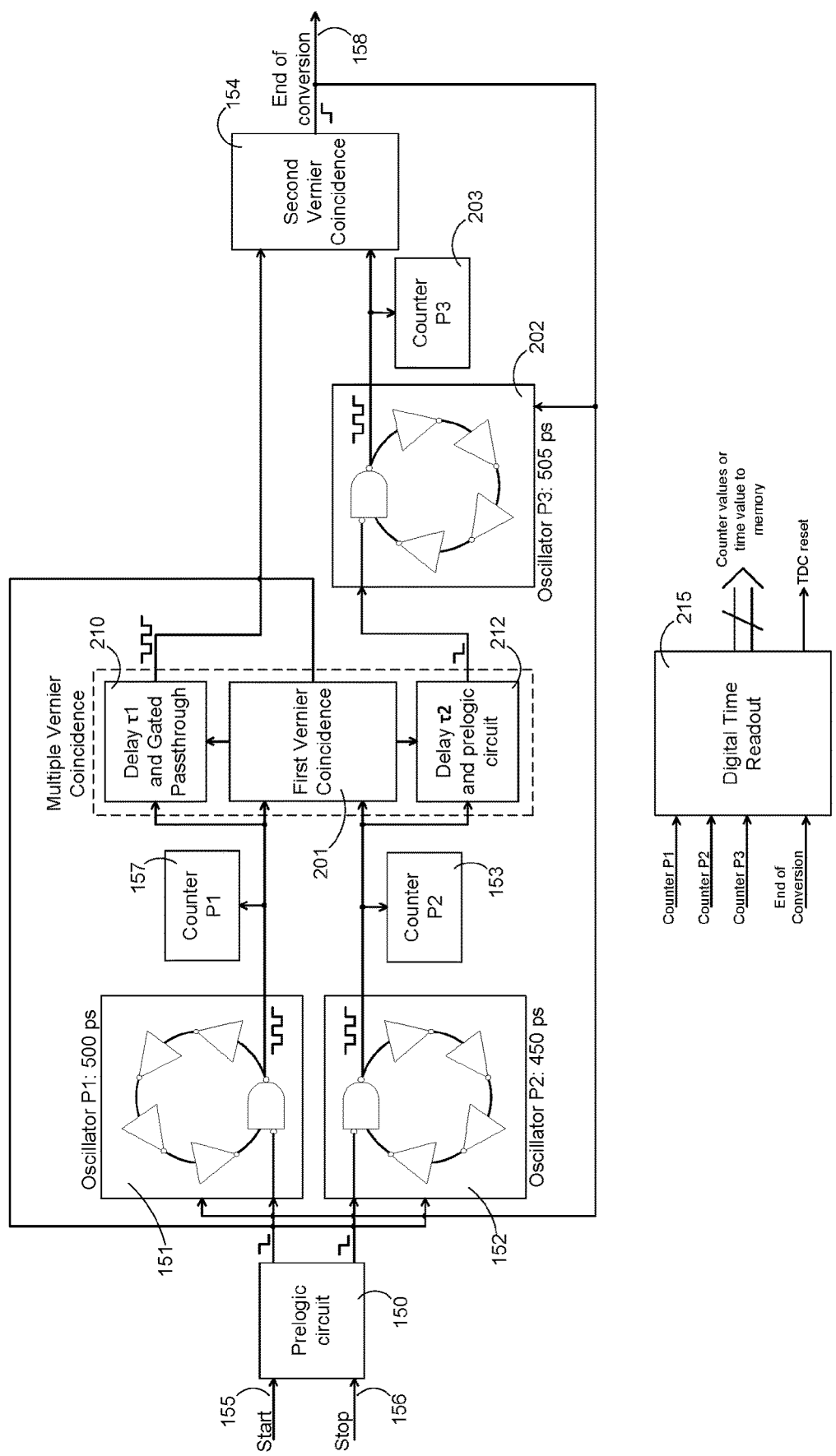
FIG. 2B is a block schematic illustrating an exemplary ring oscillator-based double Vernier TDC comprising three separate oscillators functioning at different periods with coincidence output signals connected to ring oscillators to end conversion.
Figure 2C:
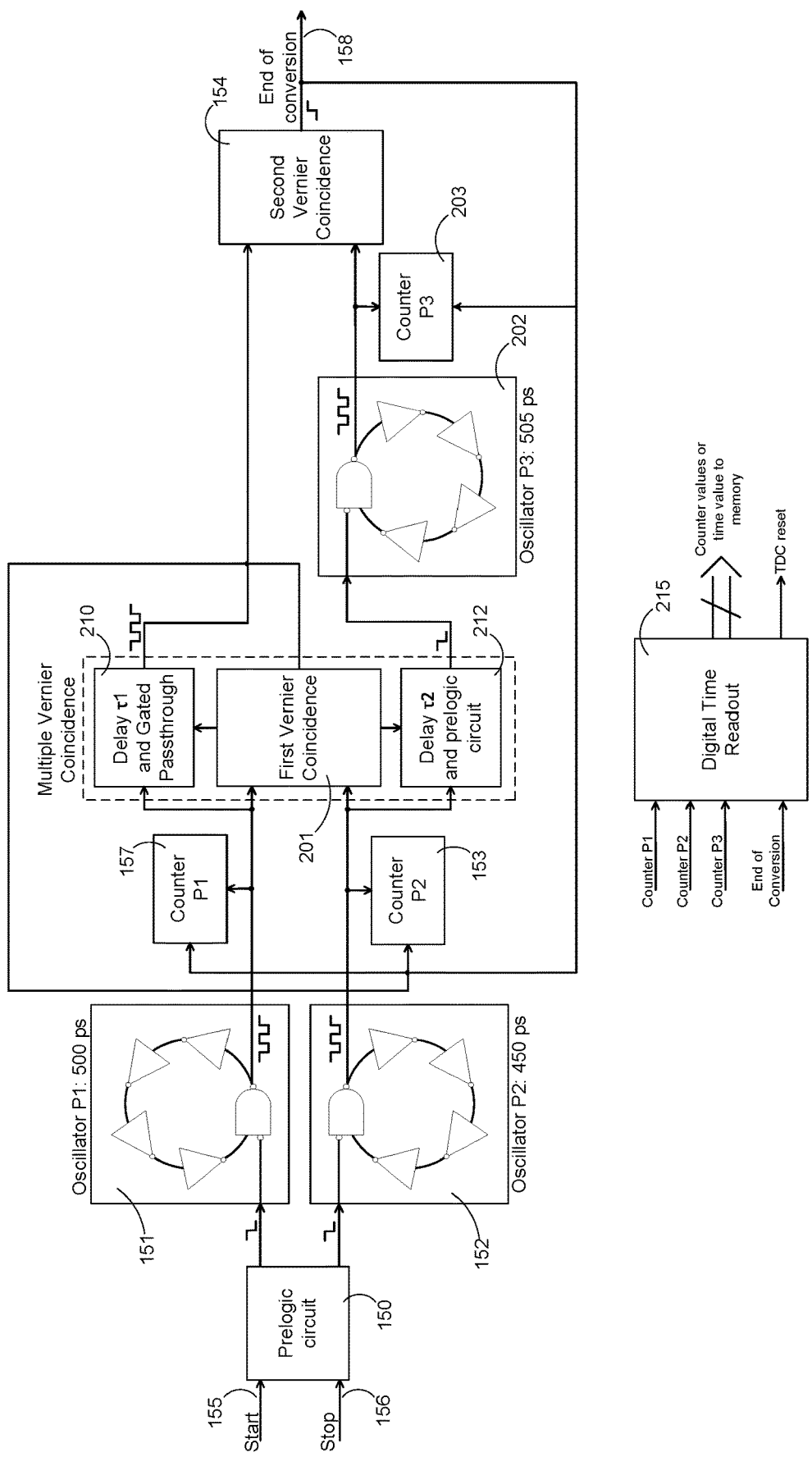
FIG. 2C is a block schematic illustrating an exemplary ring oscillator-based double Vernier TDC comprising three separate oscillators functioning at different periods with coincidence output signals connected to counters to end conversion.
Figure 2D:
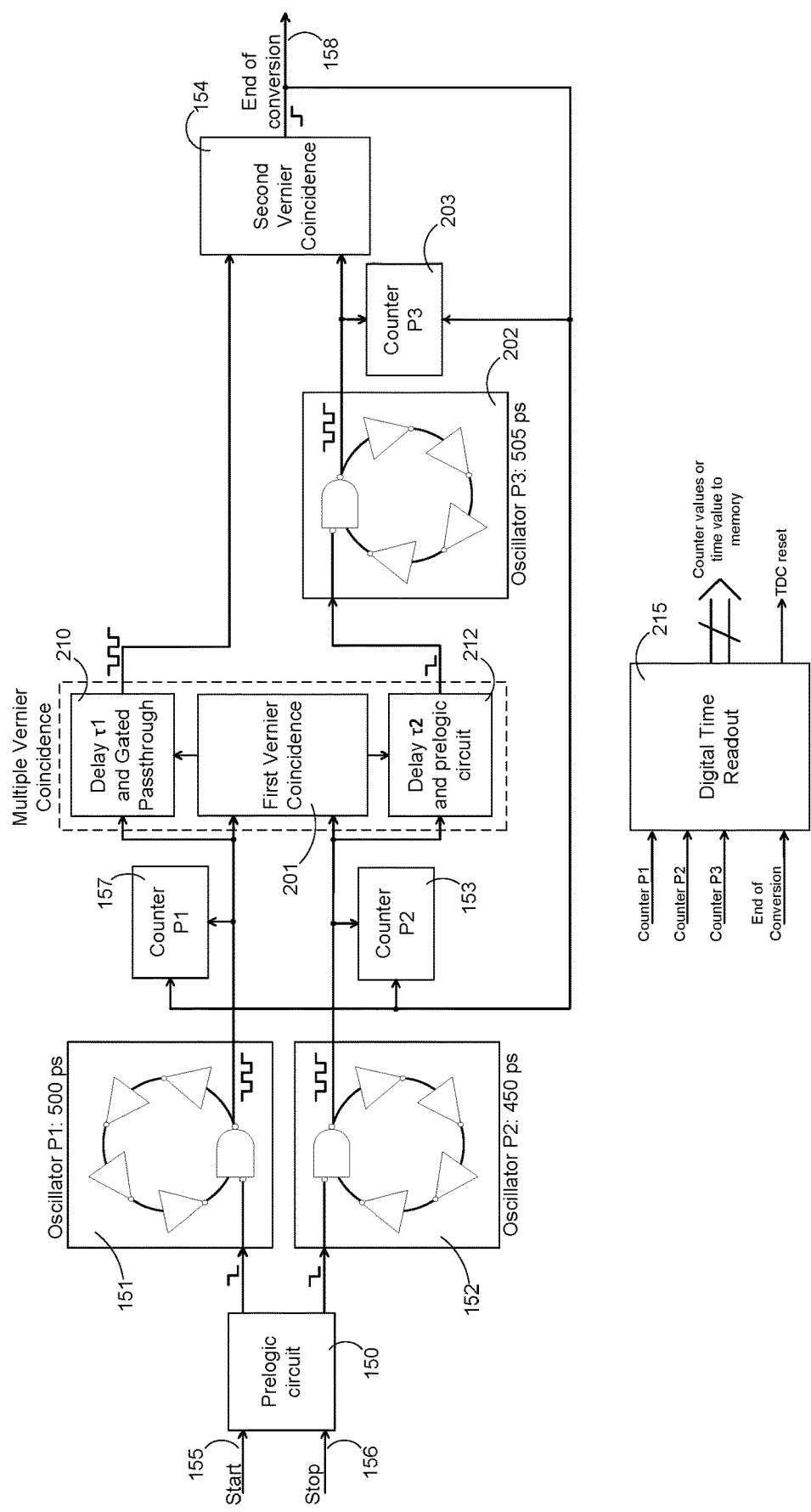
FIG. 2D is a block schematic illustrating an exemplary ring oscillator-based double Vernier TDC comprising three separate oscillators functioning at different periods with second coincidence output signal connected to all counters to end conversion.

It will be appreciated that the counters 153, 157 and 203 are shown as having two inputs in FIGS. 2C and 2D, one effectively providing a gate or start input. The counters can also have a single input when the oscillators' output can be counted directly without gating (FIGS. 2A and 2B).

Counter 157 may also be used to count P1 clock cycles prior to P2 starting. In this way, the TDC is able to resolve time differences between 155 and 156 that are longer than P1 by providing a first count value of P1 cycles and then the number of P2 cycles until coincidence occurs.

The digital value counted by counters 153 and 203 are stopped either by their respective coincidence detection circuits 201 and 154 (FIG. 2A to 2C) or by the coincidence detection circuit 154 only (FIG. 2D). In the former, each counter may have the exact number of cycles for their respective oscillator. In the latter, counter 153 may include the number of cycles of oscillator 152 and the number of cycles of oscillator 202. The digital time readout 215 may hence need to subtract counter 203 from counter 153 to find the exact number of cycles done by oscillator 152. The digital values of each counter can be collected and subtracted (forward/backward) or added (forward/forward) considering the LSB of Vernier process #1 and Vernier process #2 in a readout circuit 215. In a forward/forward scheme, it is possible to arrange the period differences such that the value of the MSB of counter 203 is half of the value of the LSB of counter 153. In this way, the binary count values of the two counters 153, 203 can be concatenated in readout 215. Otherwise, the time value needs to be calculated. The digital time readout circuit 215 may also send a reset signal to the TDC when all counter values are processed and stored in memory.

Figure 3:
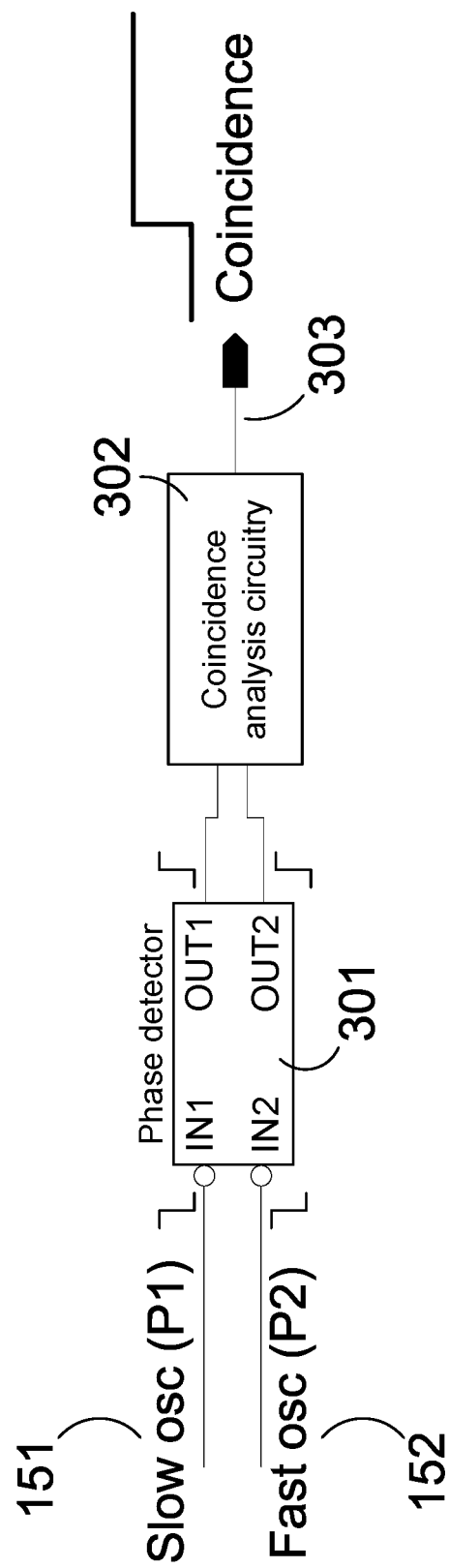
FIG. 3 is a block schematic illustrating an exemplary Vernier coincidence detection circuitry.

Now referring to FIG. 3 which illustrates an exemplary Vernier coincidence detection circuitry. The signals from the slow oscillator 151 and the fast oscillator 152 are input to a phase detector 301 which transfers the phase status of each signal to a coincidence analysis circuitry 302. This coincidence analysis circuitry 302 allows for the assessment of the difference between the phase of the slow and the fast oscillators, such that when the phase of the fast oscillator overtakes the phase of the slow oscillator, it outputs a coincidence state 303.

Figure 4:
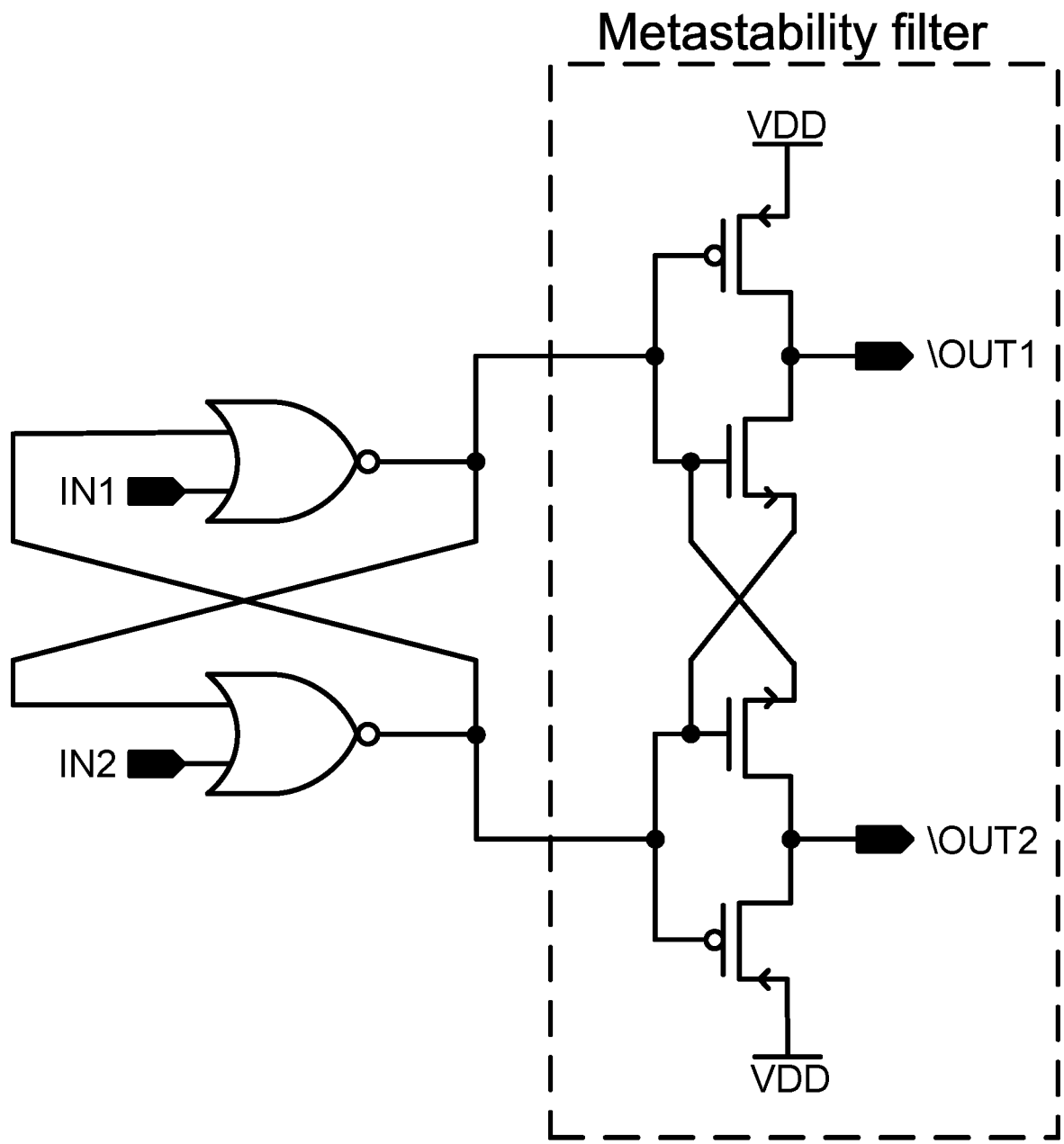
FIG. 4 is an electrical schematic illustrating an exemplary phase detector comprising a metastability filter.

The phase detector 301 of FIGS. 3 and 4 may be an arbiter circuit containing a metastability filter to ensure a valid output signal without setup and hold time issues between their inputs. Other phase detector embodiments could also be used with other metastability management circuitry.

FIG. 5A illustrates a gated pass-through circuit including a timing delay 501 for the slow oscillator. The slow oscillator 151 signal passes through a time delay 501 and subsequently through a latch and logic gates circuit to ensure that the output signal 503 is passed-through to the following Vernier process once the coincidence between the first and second oscillators occurs.

Similarly, in FIG. 5B, the fast oscillator 152 signal passes through a time delay 502 and a separate latch and logic gates circuit to produce an output start signal 504 in order to start the third oscillator 202 once the coincidence between the first and second oscillators have been found.

Figure 6:
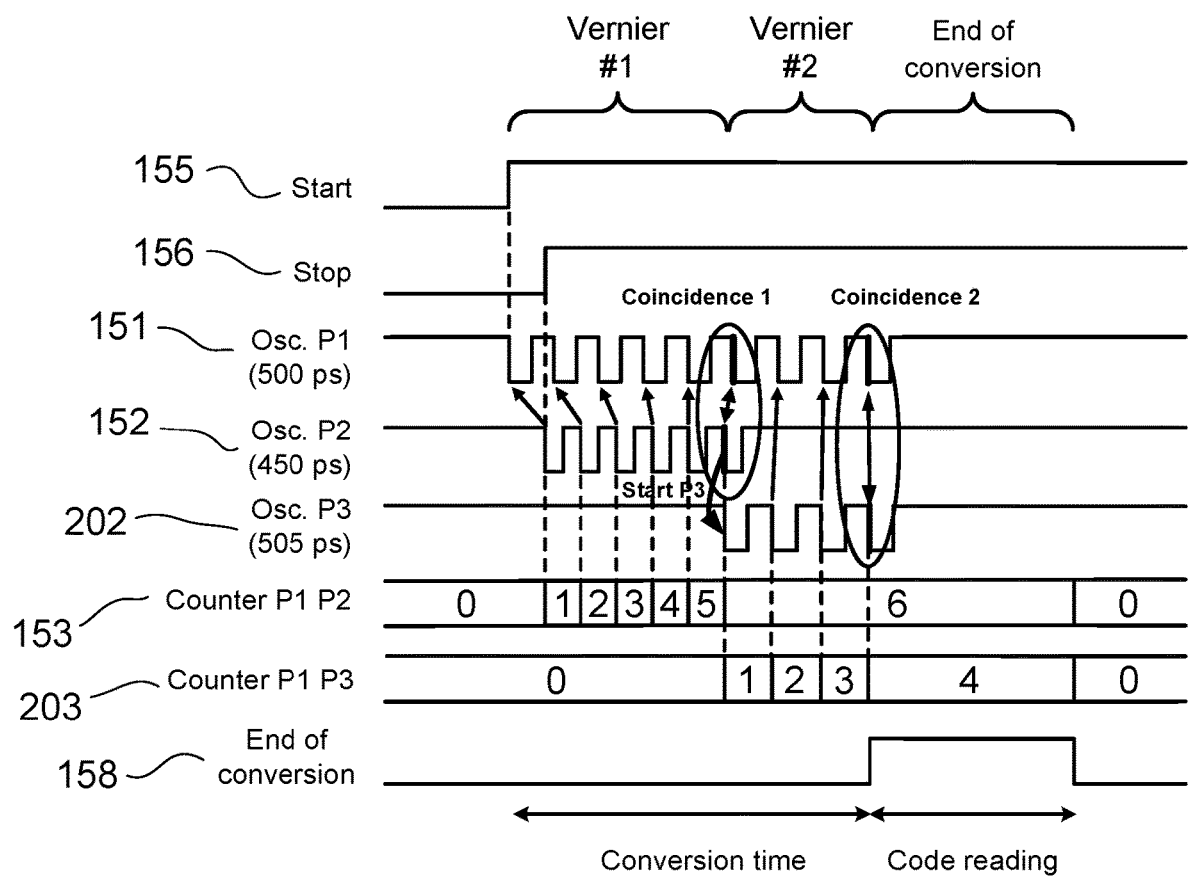
FIG. 6 is an exemplary timing diagram of an exemplary double Vernier triple oscillator TDC.

FIG. 6 is an exemplary timing diagram of an exemplary double Vernier triple oscillator TDC such as the one illustrated in FIG. 2. This timing diagram shows an example of a complete measurement cycle that may be performed by a DVTO TDC operated in a forward/backward scheme. The start signal 155 initiates the first oscillator 151, which may be a slow oscillator, running at, for example, a period of 500 ps. The stop signal 156 initiates the second oscillator 152, which may be a fast oscillator running at, for example, a period of 450 ps.

A 50 ps interpolation, in the current example, is therefore done between the first and second oscillators 151, 152, as with a conventional single Vernier process. When the coincidence occurs between the two oscillators, the fastest oscillator along with the multiple Vernier coincidence 201 circuit starts a third oscillator 202 which may be slower than the first oscillator 151, for example, a period of 505 ps may be used.

The first counter 153 retains the information of the number of cycles that were required for the first and second oscillators 151, 152 to converge towards the coincidence. The multiple Vernier coincidence 201 circuit may further allow the pass-through of the first oscillator 151 signal to the second Vernier process.

Ideally, the second Vernier process begins within the same cycle as the first Vernier coincidence, such that the residue may be kept smaller than the first Vernier LSB, but may also be at subsequent cycles without impeding the process resolution. The third oscillator 202 being slower than the first oscillator 151 in the first Vernier process, the roles are reversed compared to the first interpolation: the first oscillator 151 is catching up to the third oscillator 202 and the residue from the first interpolation is measured by the second interpolation.

The second counter 203 stores the number of cycles that were required for the convergence of the first and the third oscillators 151, 202. The second Vernier process ends the conversion 158 when the convergence has been obtained between the first and the third oscillators 151, 202. The end of conversion 158 signal stops counter 203 and/or oscillators 151, 202 and the Digital Time Readout 215 reads the counter values and resets the TDC, including all counters, such that the TDC is ready for a new measurement.

A single Vernier process, such as the prior art embodiment of FIG. 1B, with a slow oscillator at 500 ps and an LSB=5 ps would require 100 cycles (500/5) to cover the whole dynamic range. On the other hand, a dual Vernier process, as proposed in this disclosure, with a first slow oscillator 151 at 500 ps, LSB=5 ps and an intermediate Vernier process at 50 ps may only require 20 cycles (500/50+50/5) to cover the whole dynamic range, thereby reducing the timing jitter and the TDC dead time.

It will be understood by someone skilled in the art that the Vernier sequences may use different oscillator combinations to resolve the time interval (with slight connections and period changes). It should be further noted that time delays may be used as described herein in order to decide the amount of timing residue transferred to the second Vernier process.

Figure 7A:
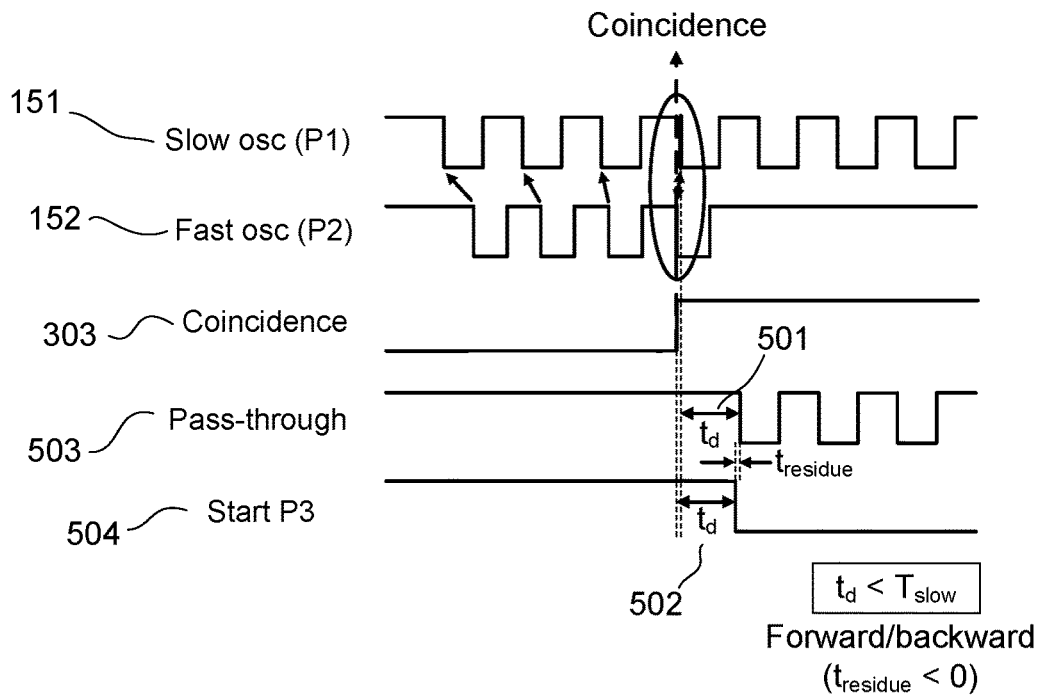
FIG. 7A is an exemplary timing diagram of the effect of a delay smaller than the slow oscillator period (forward/backward scheme) in an exemplary multiple Vernier coincidence circuitry.

FIG. 7A is an exemplary timing diagram of the effect of the delay in an exemplary gated passthrough circuit such as the one presented in FIG. 5 with a forward/backward approach ($t_d<T_{slow}$). The slow and fast oscillators 151, 152 converge and the coincidence 303 is detected by the Vernier coincidence detection circuitry. Once the coincidence 303 is reached, the signal from the slow oscillator 151 may be passed-through 503 to the subsequent Vernier process. This passed-through signal 503 may be delayed by a first time delay 501.

In this embodiment, the first time delay 501 is lower than the period of the slow oscillator 151, but higher than the coincidence assessment, such that the passed-through signal 503 may start with the coincidence time. If the time delay 501 is smaller (including a delay equals to 0) than the coincidence assessment, the residue provided to the next Vernier process is equal to the residue of the next cycle after the coincidence assessment. In other embodiments, the time delay 501 may be higher than the period of the slow oscillator 151 (FIG. 7B), such that the residue between the pass-through signal 503 and the start P3 oscillator signal 504 becomes equivalent to the residue of the $n^{th}$ cycle prior the coincidence assessment, $n^{th}$ cycle being determined by the amount of time delays. For example, a time delay between $T_{slow}$ and $2T_{slow}$ would provide the residue of one cycle prior the coincidence detection, while a time delay between $2T_{slow}$ and $3T_{slow}$ would provide the residue of two cycles prior the coincidence detection.

Figure 7B:
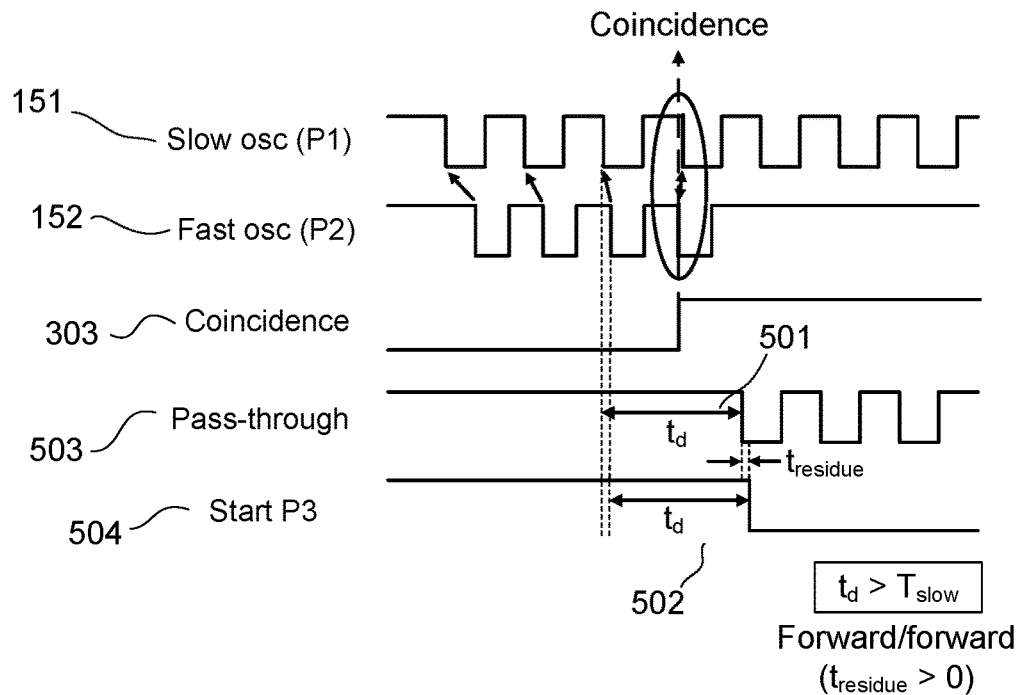
FIG. 7B is an exemplary timing diagram of the effect of a delay greater than the slow oscillator period (forward/forward scheme) in an exemplary multiple Vernier coincidence circuitry.

In the embodiment of FIGS. 7A and 7B, the second time delay 502 is set as the same as the first time delay 501. Other embodiments may use different values of time delays between the first and the second time delays.

Multiple Vernier Multiple Oscillators

While the double Vernier triple oscillator (DVTO) architecture as illustrated in FIGS. 2A, 2B, 2C and 2D may provide enough resolution with regards to the assessment time for some technologies, others may require a lower LSB for a limited conversion timeframe.

Different possibilities may be used in order to improve the resolution, such as reducing the LSB in the second Vernier process of the DVTO architecture. For example, the third oscillator 202 may be functioning at 501 ps, therefore resulting in a 1 ps LSB. This reduced LSB, although allowing for an increased output resolution, may have an impact on the time to reach the coincidence (requires more cycles before the faster oscillator catches up the slower oscillator) and the overall timing jitter of the measurement. While using this method may be acceptable for some applications, the loss in performance from the reduced LSB may not be acceptable for all uses.

Another possible solution to increase the resolution of the output, while limiting both the resolving time and the timing jitter, is to use a third subsequent cascaded Vernier process. Effectively replicating the two Vernier processes as illustrated in FIGS. 2 to 7 for the first part of the new architecture presented in FIG. 8, an additional third Vernier process is inserted before the end of the conversion 158.

Figure 8:
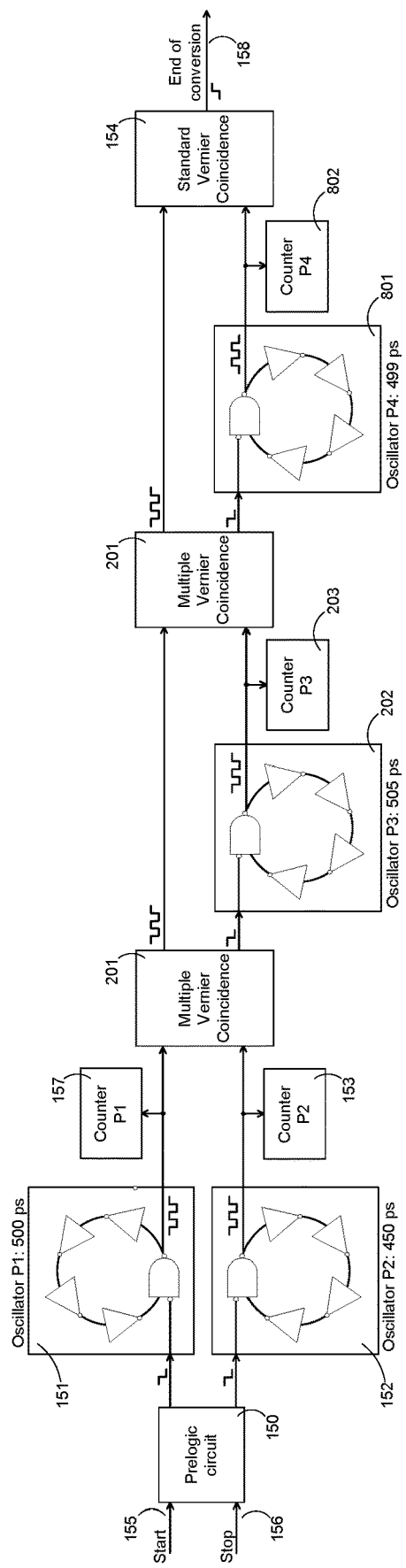
FIG. 8 is a block schematic of an exemplary ring oscillator-based triple Vernier comprising four oscillators functioning at different periods.

FIG. 8, presenting an embodiment of a triple Vernier quadruple oscillator architecture, therefore include a prelogic circuit 150 that receives and conditions a start 155 and a stop 156 signal. The first oscillator 151 is triggered by the start event whereas the second oscillator 152 is triggered by the stop signal 156. A first counter 157 records the number of cycles the slow oscillator 151 has done prior the stop 156 trigger signal, a second counter 153 registers the number of cycles that are required for the first two oscillators 151, 152 to reach the coincidence value. A first multiple Vernier coincidence 201 circuit allows, once coincidence has been reached, for the signal of the first oscillator 151 to pass-through to the second Vernier process while also triggering the start of the third oscillator 202.

This process is repeated a second time, with a second multiple Vernier coincidence 201 circuit assessing the coincidence event between the first oscillator 151 and the third oscillator 202. A third counter 203 acts the same as the second counter 153, but records the number of cycles required for this second Vernier process.

Once the coincidence between the first and the third oscillators 151, 202 has been reached, the second multiple Vernier coincidence 201 circuit allows for the signal of the first oscillator 151 to pass-through to the third Vernier process while also triggering the start of the fourth oscillator 801. A standard Vernier coincidence 154 circuit then assesses the coincidence event between the first and the fourth oscillators 151, 801 and a fourth counter 802 records the number of cycles that were required to reach the coincidence. This last coincidence results in the TDC end of conversion 158 being sent to the digital readout circuit.

In some embodiments, delays similar to the ones presented in FIGS. 5 and 7 may be included in the design of the triple Vernier quadruple oscillators' architecture of FIG. 8.

Someone skilled in the art would understand that any number of Vernier processes may be used, in the same cascaded architecture, in order to reach a desirable resolution for a given TDC resolving time, without departing from the teachings of this disclosure. Therefore, any multiple Vernier multiple oscillators may be designed, wherein the number of oscillators is always one more than the desired number of Vernier processes.

Figure 9:
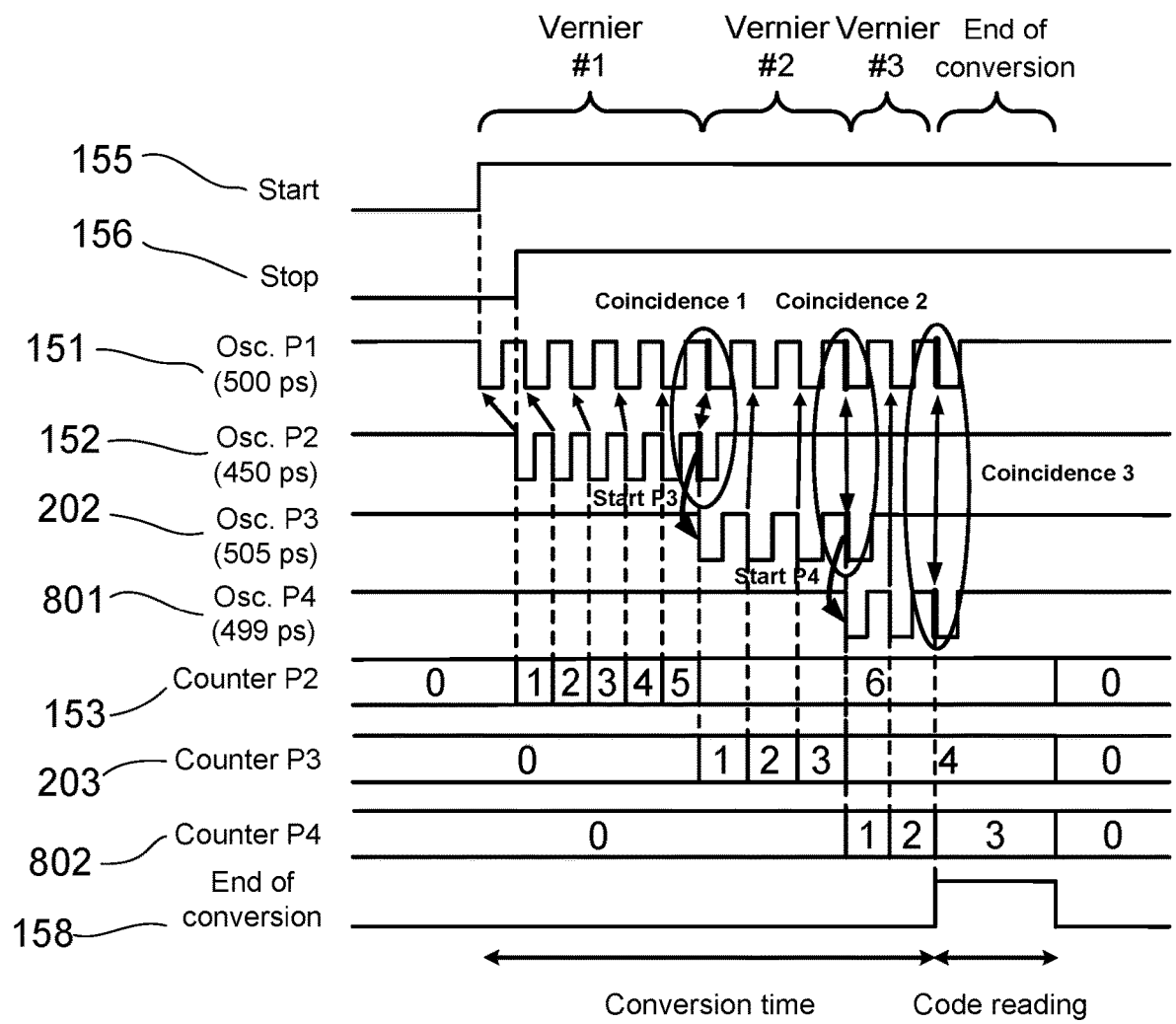
FIG. 9 is an exemplary timing diagram of an exemplary triple Vernier quadruple oscillator TDC.

FIG. 9 is an exemplary timing diagram of an exemplary triple Vernier quadruple oscillator TDC, such as the one illustrated in FIG. 8. This timing diagram shows an example of a complete measurement cycle that may be performed by a triple Vernier quadruple oscillator TDC. The start signal 155 initiates the first oscillator 151, which may be a slow oscillator, running at, for example, a period of 500 ps. The stop signal 156 initiates the second oscillator 152, which may be a fast oscillator running at, for example, a period of 450 ps.

A 50 ps interpolation is therefore done between the first and second oscillators 151, 152, as with a conventional single Vernier process. When the coincidence occurs between the two oscillators, the fastest oscillator along with the multiple Vernier coincidence 201 circuit starts a third oscillator 202 which may be slower than the first oscillator 151; for example, a period of 505 ps may be used.

The first counter 153 retains the information of the number of cycles that were required for the first and second oscillators 151, 152 to converge towards the coincidence. The first multiple Vernier coincidence 201 circuit may further allow the pass-through of the first oscillator 151 signal to the second Vernier process.

Ideally, the second Vernier process begins within the same cycle as the first Vernier coincidence to keep the residue smaller than the first Vernier LSB, but may also be at subsequent cycles without impeding the process resolution. The third oscillator 202 being slower than the first oscillator 151 in the first Vernier process, the roles are reversed compared to the first interpolation: the first oscillator 151 is catching up to the third oscillator 202 and the residue from the first interpolation is measured by the second interpolation.

The third counter 203 stores the number of cycles that were required for the convergence of the first and the third oscillators 151, 202. The second multiple Vernier coincidence 201 circuit allows the pass-through of the first oscillator 151 signal to the third Vernier process, which ideally starts within the same cycle. The second multiple Vernier coincidence 201 circuit further triggers the start of the fourth oscillator 801, which, in this example, is functioning at a faster frequency than the first oscillator 151. This last Vernier process may be done with a low LSB since the interpolation is only done on the time residue from the previous Vernier, which reduces the time to reach the coincidence. The fourth counter 802 records the value of the number of cycles that were required to reach the coincidence between the first and the fourth oscillators 151, 801.

The third Vernier process ends the conversion 158 when the convergence has been obtained between the first and the fourth oscillators 151, 801. The end of conversion 158 signal stops counter 802 and/or oscillators 151, 801 and the Digital Time Readout reads the counter values and resets the TDC including all counters 153, 203 and 802 such that the TDC is ready for a new measurement Other embodiments may converge using different methods of the Vernier process, such as always forward or always backwards convergence. A person skilled in the art will appreciate that the changes required for these alternate methods of convergence (e.g. oscillators' period and delay values) may be done without departing from the teachings of this disclosure.

Figure 10:
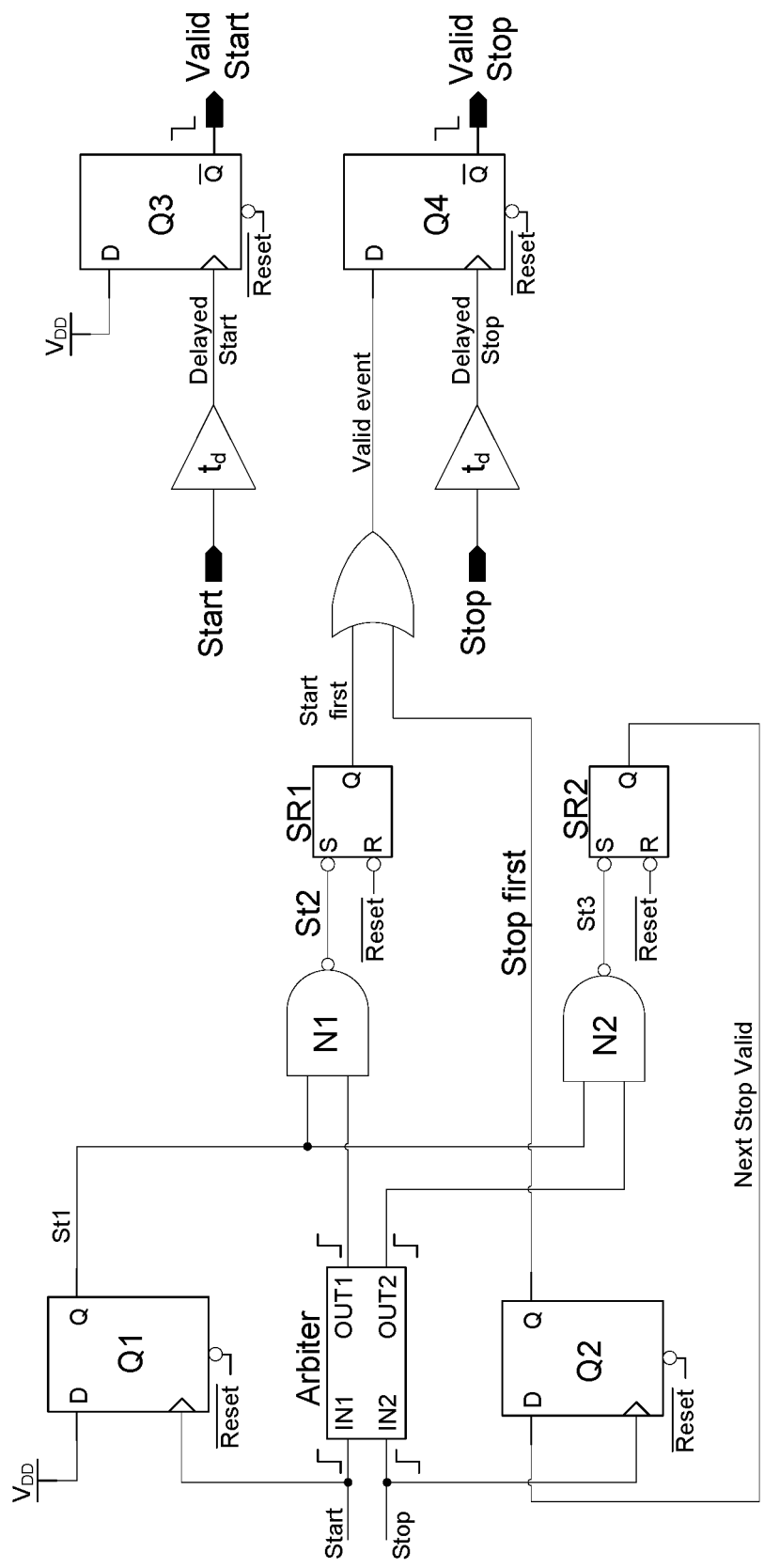
FIG. 10 is a block schematic illustrating an exemplary prelogic circuit.

FIG. 10 illustrates a block schematic of an exemplary prelogic circuit. The prelogic circuit may comprise components, such as switches, logic gates and delays, in order to ensure valid start and stop signals (e.g. the stop signal of an event must necessarily come after the start signal of that event). Although FIG. 10 presents an embodiment of a circuitry operable to perform such task, it will be understood by someone skilled in the art that other circuitry setups may be used to produce the same results.

What is claimed is:

1. A time-to-digital converter comprising:
a start/stop prelogic circuit receiving external input and providing a first gate signal and a second gate signal;
a first oscillator having a first period and initiated by one of said first and second gate signals;
a second oscillator having a second period and initiated by another of said first and second gate signals;
a third oscillator having a third period, and initiated by a third gate signal;
a first counter connected to one of said first oscillator and said second oscillator;
a third counter connected to said third oscillator;
a first coincidence circuit connected to said first oscillator and to said second oscillator and having a first coincidence output signal indicating when one of said first oscillator and said second oscillator overtakes the other;
a first delay $\tau_1$ connected to said first oscillator and having a passthrough circuit, connected to said first coincidence output signal, gating the said first oscillator output delayed by $\tau_1$;
a second delay $\tau_2$ connected to said second oscillator and having a prelogic circuit to provide a start signal, synced with said second oscillator but delayed by $\tau_2$, to said third oscillator;
a second coincidence circuit connected to said output of said first delay and to said third oscillator and having a second coincidence output signal indicating when one of said first oscillator delayed by said first delay and said third oscillator overtakes the other; and
a digital time readout connected to said first counter and said third counter and outputting a digital value for a time between said first gate signal and said second gate signal;
wherein:
at least one of said first delay and said second delay is longer than a time for said first coincidence circuit to produce said first output signal following a time when said one of said first oscillator and said second oscillator overtakes the other;
to read said first counter when said first coincidence is reached, one of:
said first counter is connected to said second oscillator, said first coincidence output signal is connected to said second oscillator to stop said second oscillator such that said first counter is halted;
said first coincidence output signal is connected to stop said first counter; and
said first coincidence output signal is connected to said digital time readout;
to read said third counter when said second coincidence is reached, one of:
said second coincidence output signal is connected to said first and third oscillator to stop said first and third oscillator such that said third counter is halted;
said second coincidence output signal is connected to stop said third counter; and said second coincidence output signal is connected to said digital time readout.

2. The time-to-digital converter of claim 1, wherein said first counter is connected to said first oscillator, further comprising a second counter connected to said second oscillator and said digital time readout is further connected to said second counter.

3. The time-to-digital converter of claim 1, wherein at least one of:
   said first coincidence circuit is connected to said start/stop prelogic circuit to stop said second oscillator when said first coincidence is reached; and
   said second coincidence circuit is connected to said start/stop prelogic circuit and to said second delay's prelogic circuit to stop said first and third oscillators when said second coincidence is reached.

4. The time-to-digital converter of claim 1, wherein said first coincidence circuit is connected to said second counter to stop said second counter when said first coincidence is reached.

5. The time-to-digital converter of claim 1, wherein said second coincidence circuit is connected to said first counter and to said third counter to stop said first and third counters when said second coincidence is reached.

6. The time-to-digital converter of claim 1, wherein said second coincidence circuit is connected to any one of said counters, said oscillators, and said prelogic circuits to stop said counters when said second coincidence is reached.

7. The time-to-digital converter of claim 1, wherein said digital time readout transforms said counters values to a time value when said second coincidence is reached.

8. The time-to-digital converter of claim 1, further comprising one or more additional oscillators and a same number of additional counters, delays and coincidence circuits, wherein said additional coincidence circuits indicates when one of said first oscillator delayed by said first delay and additional delays and said additional oscillator overtakes the other.

9. The time-to-digital converter of claim 1, wherein said first oscillator, said second oscillator and said third oscillator have a period of approximately 0.5 nanoseconds and a time resolution of said digital value for a time between said first gate signal and said second gate signal is less than 20 picoseconds.

10. The time-to-digital converter of claim 9, wherein said time resolution is less than 10 picoseconds.

11. The time-to-digital converter of claim 1, wherein at least one of said first and second delay is shorter than said time for said first coincidence circuit to produce said first output signal.

12. The time-to-digital converter of claim 1, wherein said first delay is different than said second delay.

* * * * *